United States Patent [19]
Schatz et al.

[11] Patent Number: 6,096,230
[45] Date of Patent: Aug. 1, 2000

[54] METHOD OF PLANARIZING BY POLISHING A STRUCTURE WHICH IS FORMED TO PROMOTE PLANARIZATION

[75] Inventors: Kenneth D. Schatz, Palo Alto; Brett Huff, Fremont, both of Calif.

[73] Assignee: Intel Corporation, Santa Clara, Calif.

[21] Appl. No.: 08/998,981

[22] Filed: Dec. 29, 1997

[51] Int. Cl.⁷ .................................................. H01L 21/302
[52] U.S. Cl. ............................................... 216/38; 451/28
[58] Field of Search .................................... 428/620, 687, 428/686; 438/631, 633, 634, 645, 697, 690, 691, 692; 451/28, 29, 41, 54, 30; 216/38

[56] References Cited

U.S. PATENT DOCUMENTS

| | | | |
|---|---|---|---|
| 5,036,015 | 7/1991 | Sandhu et al. | 437/8 |
| 5,257,478 | 11/1993 | Hyde et al. | 51/131.3 |
| 5,449,314 | 9/1995 | Meickle et al. | 451/41 |
| 5,674,784 | 10/1997 | Jang et al. | 437/195 |
| 5,795,495 | 8/1998 | Meikle | 216/88 |

*Primary Examiner*—John J. Zimmerman
*Attorney, Agent, or Firm*—Blakely, Sokoloff, Taylor & Zafman LLP

[57] ABSTRACT

A method of planarizing comprising providing a substrate having an uneven surface topography, forming a layer on the substrate, wherein the layer has a graded resistance to polishing, and polishing the layer.

10 Claims, 5 Drawing Sheets

6,096,230

METHOD OF PLANARIZING BY POLISHING A STRUCTURE WHICH IS FORMED TO PROMOTE PLANARIZATION

BACKGROUND OF THE INVENTION

1). Field of the Invention

The present invention relates to semiconductor processing and more particularly to a method of planarizing by polishing a structure which is formed to promote planarization.

2). Discussion of Related Art

Semiconductor chips are manufactured by depositing consecutive layers of a material on a substrate. One or more of these layers are formed on a substrate having an uneven topography. The resulting layer has a number of high surfaces and lower surfaces and oftentimes has to be polished back to remove some of the material of the high surfaces. During polishing of the layer to remove the material of the high surfaces some of the material of the lower surfaces is also removed. The polish rate of the layer is thus reduced because of removal of the material of the lower surfaces. Should less of the material of the lower surfaces be removed, a higher polish rate would result and a more planar polished layer.

FIGS. 1a to 1c illustrate a conventional polishing technique of the aforementioned kind.

FIG. 1a of the accompanying drawings illustrates a semiconductor substrate 10 having a number of members 12a, 12b and 12c formed thereon with gaps 14a and 14b formed between the members. The resulting substrate 16 thus has an uneven topography.

The members 12 may be any members generally found in semiconductor integrated circuits. The members 12 may, for example, be metal or other members requiring an inter-layer dielectric (ILD) over the members 12. The members 12 may, alternatively, be metal members requiring an inter-metal dielectric (IMD) between the members 12. The members 12 may, alternatively, be part of a structure with the gaps 14 etched therein for purposes of forming a shallow-trench isolation (STI) region in the gaps. The members 12 may, alternatively, be of an insulating material and the gaps 14 be gaps which are etched into the insulating material for purposes of forming vias such as tungsten plug vias in the gaps 14. The members 12 may, alternatively, be of an insulating material and the gaps 14 be gaps which are etched into the insulating material for purposes of forming aluminum, aluminum alloy, copper or copper alloy metal lines using a damascene process.

FIG. 1b illustrates the structure of FIG. 1a after a layer 18 of material is formed thereon. The layer 18 has an upper surface 20, which has a profile which is dictated by the topography of the substrate 16. High surfaces 22a, 22b and 22c of the surface 20 are located above the members 12a, 12b, 12c and the surface 20 has lower surfaces 24a and 24b in the region of the gaps 14a, 14b.

FIG. 1c illustrates the structure of FIG. 1b after a polishing step carried out until the members 12a, 12b, 12c are exposed. Polishing causes the high surfaces 22a, 22b and 22c to be removed. However, some of the material of the lower surfaces 24a, 24b is also removed so that topography of the layer 18 before polishing is reflected on the structure after polishing. An upper surface of the structure after polishing thus has a profile with a dish 26a and 26b between each of the respective members 12a, 12b, 12c.

A planarization method is thus required which will result in a faster polish rate and a more planar surface after polishing.

SUMMARY OF THE INVETION

A method of planarizing is described. A substrate is provided having an uneven surface topography. A layer is formed on the substrate, the layer having a graded resistance to polishing.

BRIEF DESCRIPTION OF THE DRAWINGS

The present invention is illustrated by way of example and not limitation in the accompanying figures in which.

DETAILED DESCRIPTION OF THE INVENTION

A method of planarizing is disclosed. In the following description, numerous specific details are set forth such as specific materials, methods, etc. in order provide a thorough understanding of the present invention. It will be obvious, however, to one skilled in the art that these specific details need not be employed to practice the present invention. In other instances, well known materials or methods have not been described in detail in order to avoid unnecessary obscuring of the present invention.

The present invention is for a method for planarizing. A layer is deposited on a substrate having an uneven topography. The layer has a number of high surfaces and lower surfaces. The layer is then polished back so that the high surfaces are removed faster than the lower surfaces. The layer has a graded resistance to polishing so that removal of the high surfaces is enhanced while removal of the lower surfaces is reduced.

Figure 2A:
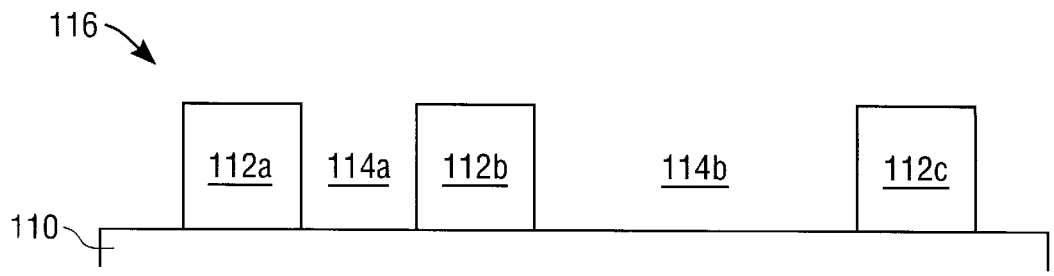
FIG. 2a is a cross-sectional view of a semiconductor substrate having an uneven surface topography.

FIG. 2a illustrates a semiconductor substrate 110 having a number of members 112a, 112b, 112c formed thereon with gaps 114a and 114b formed between the members. The resulting substrate 116 thus has an uneven topography.

The members 112 may be any members generally found in semiconductor integrated circuits. The members 112 may, for example, be metal or other members requiring an inter-layer dielectric (ILD) over the members 112. The members 112 may, alternatively, be metal members requiring an inter-metal dielectric (IMD) between the members 112. The members 112 may, alternatively, be part of a structure with the gaps 14 etched therein for purposes of forming a shallow-trench isolation (STI) region in the gaps. The members 112 may, alternatively, be of an insulating material and the gaps 114 be gaps which are etched into the insulating material for purposes of forming aluminum, aluminum alloy, copper or copper alloy metal lines using a damascene process. ILDs, IMDs, STI regions, vias and damascene processes are all known in the art of semiconductor chip fabrication and are not further elaborated on herein. For purposes of further explanation the description that follows is primarily directed at the formation of an IMD, although it should be understood that the general principles of the invention can be utilized for other purposes, including the formation of ILDs, STIS, vias and damascene processes.

Figure 2B:
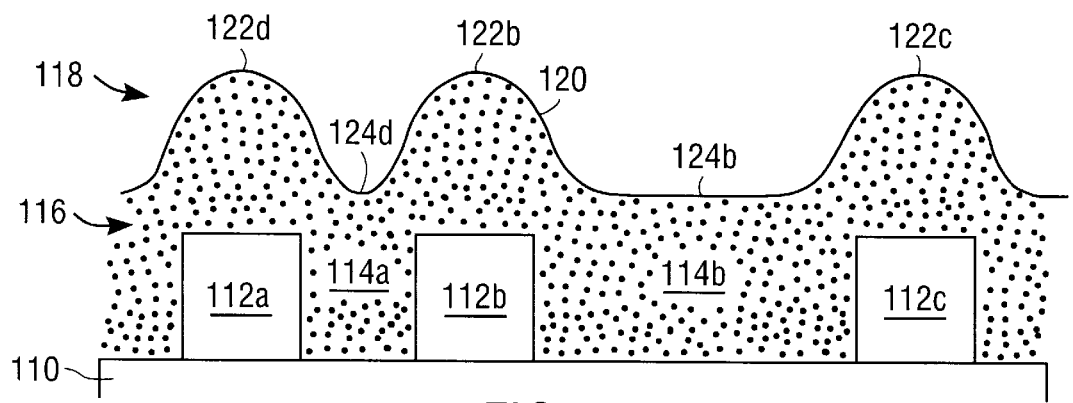
FIG. 2b is a cross-sectional view of the structure of FIG. 2a after a layer of material has been partially deposited on the substrate.

FIG. 2b illustrates the structure of FIG. 2a after a first portion 118 of a layer of material is formed thereon. The first portion 118 has an upper surface 120 which has a profile which is dictated by the topography of the substrate 116. High surfaces 122a, 122b, 122c of the surface 120 are located above the members 112a, 112b, 112c and the surface 120 has lower surfaces 124a, 124b in the region of the gaps 114a, 114b.

The material of the first portion 118, for purposes of forming an IMD, may be silicon dioxide ($SiO_2$) a hydrogen-containing silicon oxide, ($Si_xO_yH_z$ where x, y, and z are variable), phosphosilicate glass (PSG—chemical formula $Si_xO_yP_z$ where x, y, and z are variable), borophosphosilicate glass (BPSG chemical formula $Si_xO_yB_zP_a$ where x, y, z and a are variable), or a fluorosilicate (SiOF).

Figure 2C:
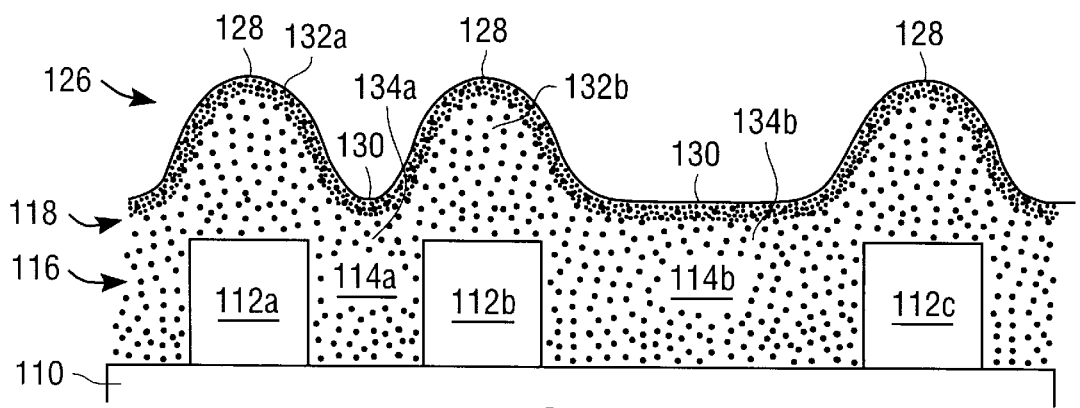
FIG. 2c is a cross-sectional view of the structure of FIG. 2b after a the layer has been completely deposited on the layer of material.

FIG. 2c illustrates the structure of FIG. 2b after a sacrificial portion 126 of the layer is further formed on the first portion 118. The sacrificial portion 126 generally conforms to the contour of the surface 120 of the first portion 118. The sacrificial portion 126 has a resistance to polishing which is greater than the resistance to polishing of the first portion 118. The first portion 118 together with the sacrificial portion 126 thus have a graded resistance to polishing from bottom to top.

The structure of FIG. 2c thus has a sacrificial portion 126 with high surfaces 128a, 128b and lower surfaces 130a, 130b, respective first parts 132a, 132b of the first portion 118 below the high surfaces 128a, 128b and respective second parts 134a, 134b of the first portion 118 below the lower surfaces 124a, 124b.

The grading of the resistance to polishing of the first portion 118 and the sacrificial portion 126 may be obtained according to different methods.

If, for example, the first portion 118 is of a material comprising silicon dioxide, a hydrogen-containing silicon oxide, PSG or SiOF then the sacrificial portion 126 may be made of the same material, but by altering the deposition parameters when the sacrificial portion 126 is formed. If the first portion 118 and the sacrificial portion are deposited in a plasma enhanced chemical vapor deposition (PECVD) process then grading may be obtained by reducing the radio frequency (RF) power supplied during the PECVD process. A reduction in the RF power would result in a sacrificial portion 126 with less compressive and higher tensile stress, and thus a higher resistance to polishing.

The ratio of parts of the first portion 118 and the sacrificial portion 126 may, alternatively, be altered in order to obtain grading.

If, for example, the first portion 118 is made of PSG, then grading may be obtained by reducing the phosphorus content during the formation of the sacrificial portion 126. The phosphorus content may partially reduced or be reduced to zero.

If, for example, the first portion 118 is made of BPSG then grading may be obtained by reducing the boron or phosphorus content, or both the boron and phosphorus content, during the formation of the sacrificial portion 126. Either the boron content or the phosphorus content, or both the boron content and the phosphorus content, may be partially reduced or be reduced to zero.

If, for example, the first portion 118 comprises a fluorosilicate which is made by doping silicon dioxide glass with fluorine, then grading may be obtained by decreasing the fluorine content during formation of the sacrificial portion 126. The fluorine content may be partially reduced or be reduced to zero.

FIGS. 2d to 2g illustrate a polishing operation which is carried out on the structure of FIG. 2c.

Figure 2D:
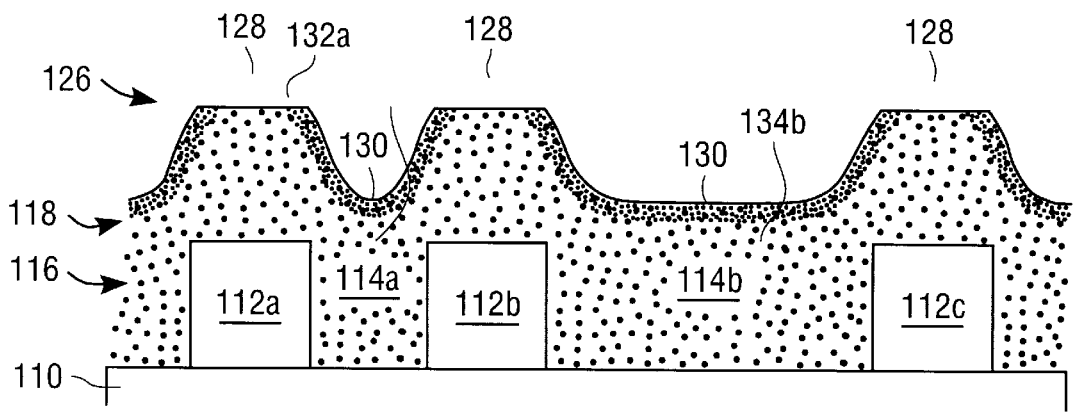
FIG. 2d is a cross-sectional view of the structure of FIG. 2c after an initial polishing step.

FIG. 2d illustrates the structure of FIG. 2c after an initial polishing step. The high surfaces 128 of the polish resistant sacrificial portion 126 are removed first, leaving the less resistant first parts 132 of the first portion 118 exposed.

Figure 2E:
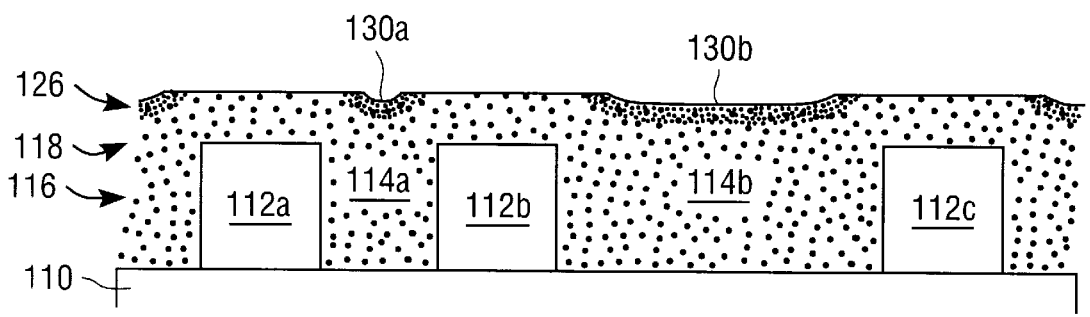
FIG. 2e is a cross-sectional view of the structure of FIG. 2d after a further polishing step.

FIG. 2e illustrates the structure of FIG. 2d after a further polishing step. The respective first parts 132 of the first portion 118, being exposed, are removed relatively quickly. The lower surfaces 130a, 130b of the sacrificial portion 126 are, however, more resistant to polishing than the respective first parts 132a, 132b. Because of the relatively low resistance to polishing of the respective first parts 132a, 132b to polishing, and the relatively high resistance to polishing of the respective lower surfaces 130a, 130b, a structure results which is polished to be more planar than would be the case without the sacrificial portion 126. The formation of the sacrificial portion thus assists in promoting planarization during polishing.

Figure 2F:
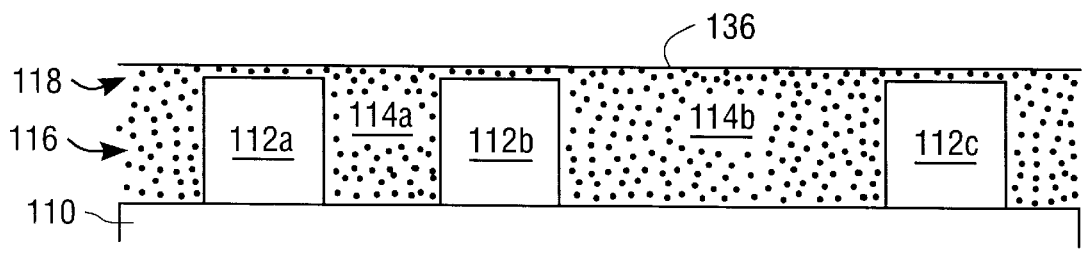
FIG. 2f is a cross-sectional view of the structure of FIG. 2e after a yet a further polishing step.

FIG. 2f illustrates the structure of FIG. 2e after yet a further polishing step. The polishing step removes the remaining portions of the sacrificial portion 126 defining the lower surfaces 130a, 130b. The structure of FIG. 2f, after removal of the remaining portions of the sacrificial portion 126, has an upper surface 136 which is much more planar than would be the case without the sacrificial portion and the gradedly resistant polishing effects that it has.

Figure 1A:
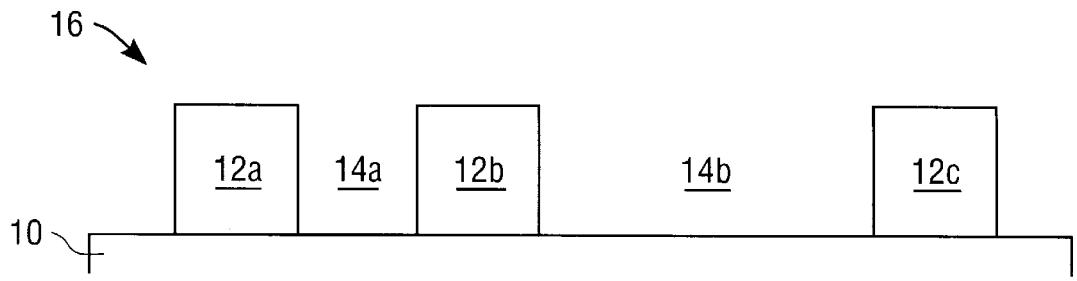
FIG. 1a is a cross-sectional view of a semiconductor substrate having an uneven topography.
Figure 1B:
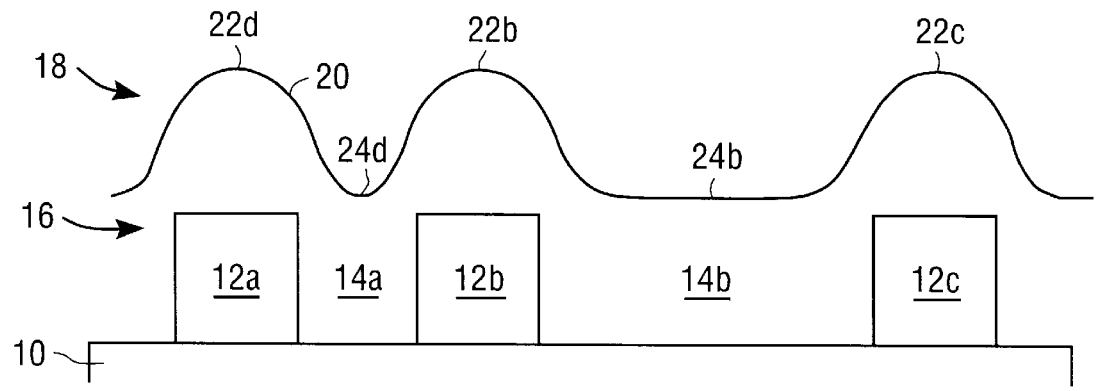
FIG. 1b is a cross-sectional view of the structure of FIG. 1a after a layer of material has been deposited on the substrate.
Figure 1C:
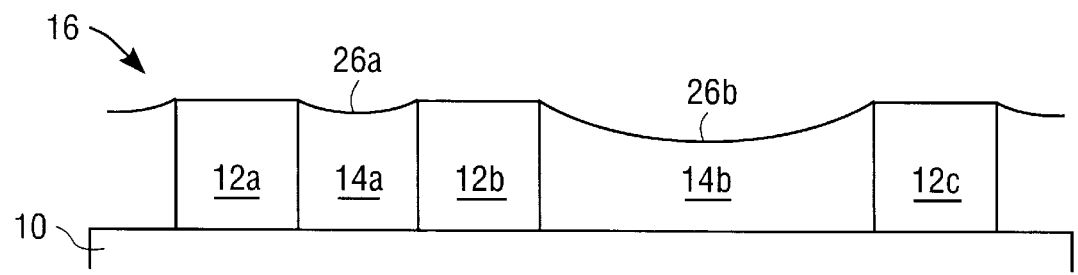
FIG. 1c is a cross-sectional view of the structure of FIG. 1b after a polishing step.
Figure 2G:
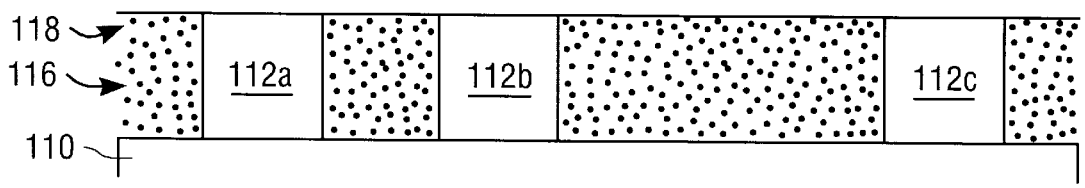
FIG. 2g is a cross-sectional view of the structure of FIG. 2f after a yet a further polishing step.

The members may be formed with polish stop components and the layer 116 may be further polished down onto the polish stop layer to finalize the formation of the IMD, as shown in FIG. 2g. The finalized IMD does not have the severe throughs as shown in FIG. 1c after conventional planarization.

The sacrificial portion may be formed differently depending on the required, final structure or process utilized. The following examples illustrate different methods of forming the sacrificial portion.

EXAMPLE 1

An ILD, IMD, or STI region may be formed with silicon dioxide, a hydrogen-containing silicon oxide, PSG or a fluorosilicate by altering the process parameters during deposition of these materials. For deposition utilizing plasma enhanced chemical vapor deposition, the radio frequency power may be reduced in order to form a sacrificial portion with less compressive and more tensile stress. A sacrificial portion with more tensile stress is generally more resistant to polishing.

EXAMPLE 2

An ILD or IMD may be formed with PSG or BPSG. The sacrificial portion may be formed by reducing the boron content or the phosphorus content, or both, during material deposition.

EXAMPLE 3

An ILD, IMD or STI region may be formed with a fluorosilicate. The sacrificial portion may then be formed by reducing the fluorine content during material deposition.

EXAMPLE 4

An ILD, IMD, or STI region may be formed with silicon dioxide, a hydrogen-containing silicon oxide, PSG, BPSG or a fluorosilicate. The sacrificial portion may then be formed with a silicon oxynitride ($Si_xO_yN_zH_a$ where x, y, z and a are variable), a silicon nitride ($Si_xN_yH_z$ where x, y and z are variable), silicon carbide, boron nitride or polycrystalline silicon.

Although the aforegoing description with reference to FIGS. 2a to 2g is directed to a method of planarizing wherein a layer is deposited having a graded resistance to polishing, it should be understood that the sacrificial portion may be in the form of a separate layer. FIGS. 3a to 3g illustrate an embodiment of the invention wherein a separate sacrificial layer is deposited.

Figure 3A:
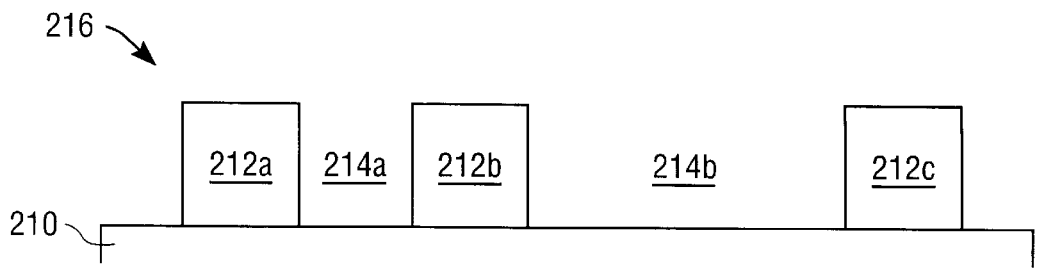
FIG. 3a is a cross-sectional view of a semiconductor substrate having an uneven surface topography.

FIG. 3a illustrates a semiconductor substrate 210 having a number of members 212a, 212b, 212c formed thereon with gaps 214a and 214b formed between the members. The resulting substrate 216 thus has an uneven topography.

The members 212 may be a dielectric which has been patterned with the gaps 214 for purposes of forming vias such as tungsten plug via within the gaps, or for purposes of forming a conductive structure over the members 212 and into the gaps 214. For purposes of further explanation the description that follows is primarily directed at the formation of metal lines utilizing a damascene process.

Figure 3B:
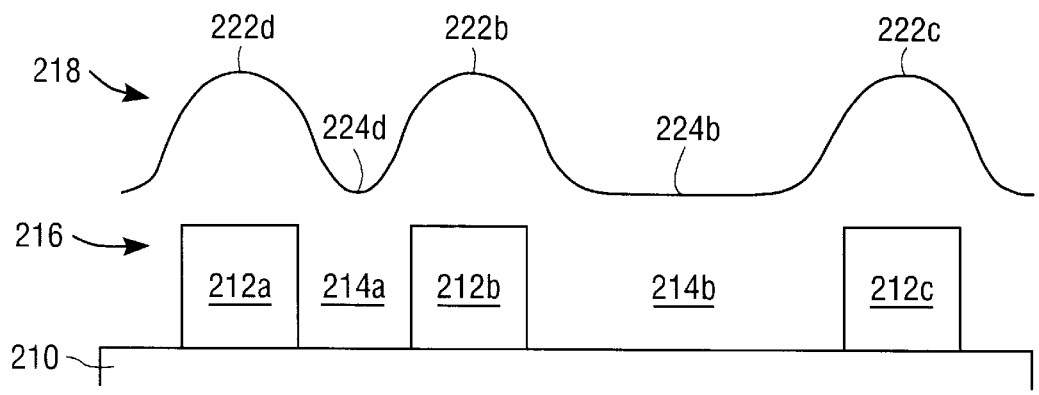
FIG. 3b is a cross-sectional view of the structure of FIG. 3a after a layer of material has been deposited on the substrate.

FIG. 3b illustrates the structure of FIG. 3a after a layer 218 of metal is formed thereon. The layer 218 has an upper surface 220 which has a profile which is dictated by the topography of the substrate 216. High surfaces 222a, 222b, 222c of the surface 220 are located above the members 212a, 212b, 212c and the surface 220 has lower surfaces 224a, 224b in the region of the gaps 214a, 214b.

The material of the layer 218, for purposes of forming metal lines utilizing a damascene process, may be aluminum, aluminum alloy, copper, or copper alloy.

Figure 3C:
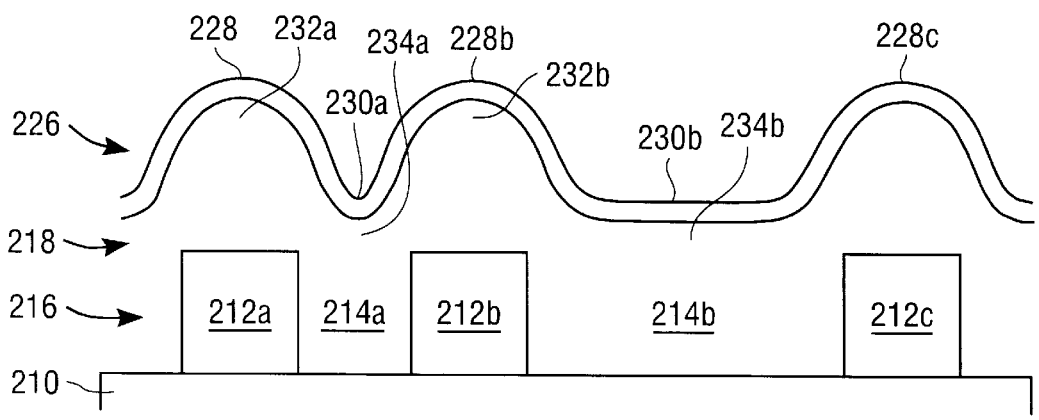
FIG. 3c is a cross-sectional view of the structure of FIG. 3b after a sacrificial layer has been deposited on the layer of material.

FIG. 3c illustrates the structure of FIG. 3b after a sacrificial layer 226 is formed on the layer 218. The sacrificial layer 226 generally conforms to the contour of the surface 220 of the layer 218. The sacrificial layer 226 has a resistance to polishing which is greater than the resistance to polishing of the layer 218.

The structure of FIG. 3c thus has a sacrificial layer 226 with high surfaces 228a, 228b and lower surfaces 230a, 230b, respective first parts 232a, 232b of the layer 218 below the high surfaces 228a, 228b and respective second parts 234a, 234b of the layer 218 below the lower surfaces 224a, 224b.

The differences in resistances to polishing of the layer 218 and the sacrificial layer 226 may be obtained according to different methods. For purposes of forming metal lines utilizing a damascene process, the sacrificial layer may be formed with titanium or titanium nitride.

FIGS. 3d to 3g illustrate a polishing operation which is carried out on the structure of FIG. 3c.

Figure 3D:
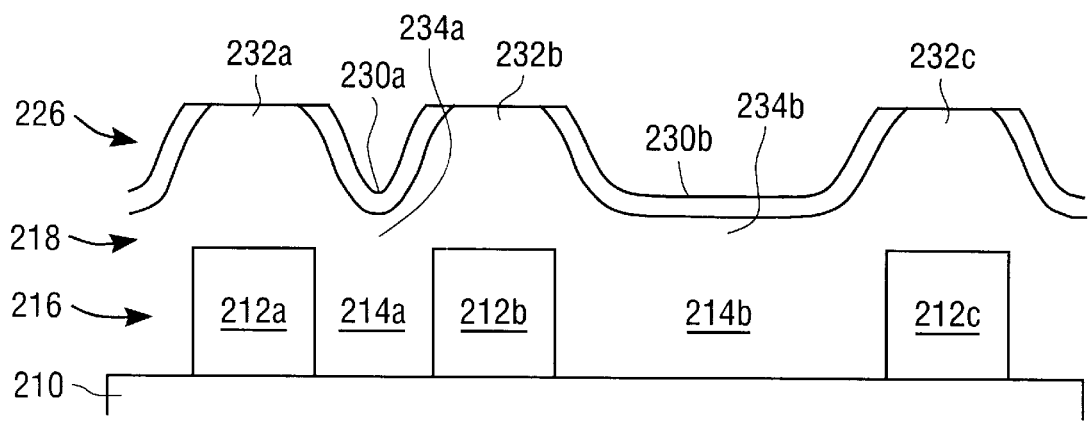
FIG. 3d is a cross-sectional view of the structure of FIG. 3c after an initial polishing step.

FIG. 3d illustrates the structure of FIG. 3c after an initial polishing step. The high surfaces 228 of the polish resistant sacrificial layer 226 are removed first, leaving the less resistant first parts 232 of the layer 218 exposed.

Figure 3E:
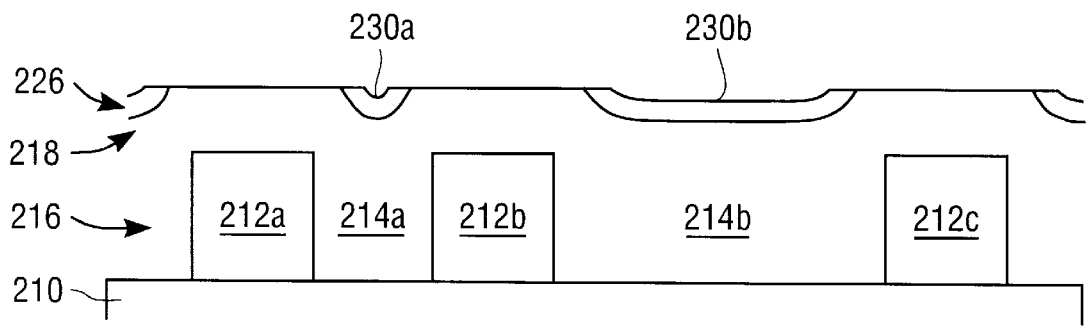
FIG. 3e is a cross-sectional view of the structure of FIG. 3d after a further polishing step.

FIG. 3e illustrates the structure of FIG. 3d after a further polishing step. The respective first parts 232 of the layer 218, being exposed, are removed relatively quickly. The lower surfaces 230a, 230b of the sacrificial layer 226 are, however, more resistant to polishing than the respective first parts 232a, 232b. Because of the relatively low resistance to polishing of the respective first parts 232a, 232b to polishing, and the relatively high resistance to polishing of the respective lower surfaces 230a, 230b, a structure results which is polished to be more planar than would be the case without the sacrificial layer 226. The formation of the sacrificial layer thus assists in promoting planarization during polishing.

Figure 3F:
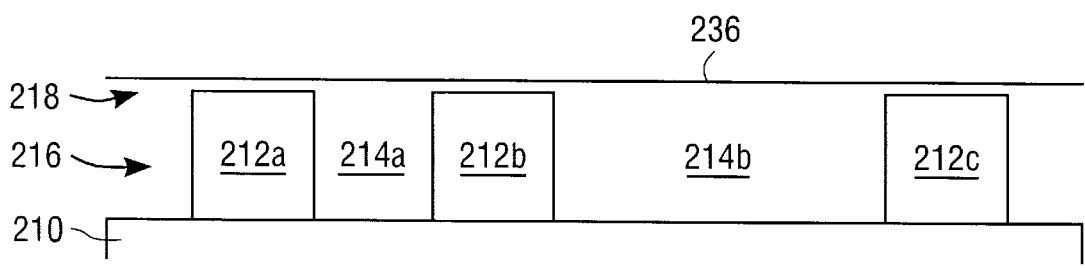
FIG. 3f is a cross-sectional view of the structure of FIG. 3e after a yet a further polishing step.

FIG. 3f illustrates the structure of FIG. 3e after yet a further polishing step. The final polishing step removes the remaining portions of the sacrificial layer 226 defining the lower surfaces 230a, 230b. The layer 216, after removal of the remaining portions of the sacrificial layer 226, has an upper surface 236 which is much more planar than would be the case without the sacrificial layer and the gradedly resistant polishing effects that it has.

Figure 3G:
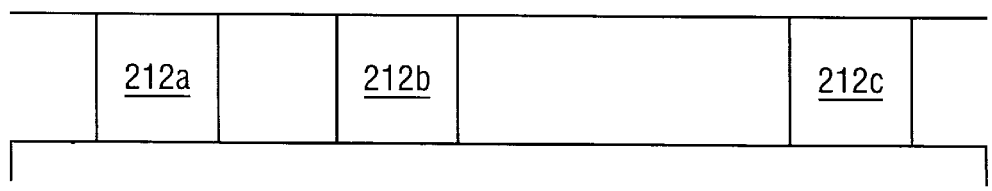
FIG. 3g is a cross-sectional view of the structure of FIG. 3f after a yet a further polishing step.

The members may be formed with polish stop components and the layer 216 may be further polished down onto the polish stop layer to finalize the formation of the metal lines, as shown in FIG. 3g. The finalized metal lines do not have the severe throughs as shown in FIG. 1c after conventional planarization.

The sacrificial layer may be formed differently depending on the required, final structure or process utilized. The following examples illustrate different methods of forming the sacrificial layer.

EXAMPLE 5

A via may be formed by depositing the first layer 218 from a material such as tungsten, or metal lines may be formed utilizing a damascene process with aluminum, aluminum alloy, copper or copper alloy as the material of the first layer 218. The sacrificial layer may then be formed with titanium or titanium nitride.

Thus, a method of planarizing is described. Although specific embodiments, including specific materials and methods have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed:

1. A method of forming material within at least one gap between two members on a substrate, comprising:

forming a layer on the substrate, wherein the layer has high surfaces above the members and a low surface above the gap and a resistance to polishing which increases away from the substrate so as to have a first portion over the substrate and a sacrificial portion over the first portion, the sacrificial portion having a higher resistance to polishing than the first portion;

polishing the layer in a first polishing action to remove high portions of the sacrificial portion above the members and leave less polish resistant parts of the first portion above the members exposed; and polishing the layer in a further polishing action to remove the less polish resistant parts of the first portion while the lower surface of the sacrificial portion above the gap resists polishing more than the less polish resistant parts.

2. The method of claim 1 wherein the resistance to polishing increases towards the top due to the reduction of a substance in the layer.

3. The method of claim 2 wherein the layer is made of phosphosilicate glass and the resistance to polishing is influenced by reducing the phosphorus content of the layer.

4. The method of claim 2 wherein the layer is made of borophosphosilicate glass and the resistance to polishing is influenced by reducing the phosphorus content of the layer.

5. The method of claim 2 wherein the layer is made of borophosphosilicate glass and the resistance to polishing is influenced by reducing the boron content of the layer.

6. The method of claim 2 wherein the layer is made of a fluorosilicate and the resistance to polishing is influenced by reducing the fluorine content of the layer.

7. The method of claim 2 wherein the resistance to polishing is achieved by altering deposition parameters during deposition of the layer.

8. The method of claims wherein the layer is deposited utilizing a plasma enhanced chemical vapor deposition process and resistance to polishing is influenced by reducing radio frequency power supplied during the process.

9. A method of forming material within at least one gap between two members on a substrate, comprising:

forming a first layer on the substrate so that the first layer has high surfaces above the members and a low surface above the gap;

forming a second layer on the first layer, wherein the second layer has high surfaces above the members and a low surface above the gap, the second layer having a higher resistance to polishing than the first layer;

polishing the second layer in a first polishing action to remove high portions of the second layer above the members and expose less polish resistant parts of the first layer above the members; and polishing the layers in a further polishing action to remove the less polish resistant parts of the first layer while a lower surface of the sacrificial portion above the gap resists polishing more than the less polish resistant parts.

10. The method of claim 9 wherein the first layer is deposited from a material selected from the group consisting of tungsten, aluminum, aluminum alloy, copper and copper alloy and the second layer is deposited from a material selected from the group consisting of titanium and titanium nitride.

* * * * *